(12) United States Patent
Wang et al.

(10) Patent No.: US 12,624,901 B2
(45) Date of Patent: May 12, 2026

(54) THIN HEAT PIPE WITH SINTERED POWDERED WICK STRUCTURE

(71) Applicant: PURPLE CLOUD DEVELOPMENT PTE. LTD., Singapore (SG)

(72) Inventors: Xue Mei Wang, Hui Zhou City (CN); Xiao Min Zhang, Hui Zhou City (CN); Hua-Yuan Lin, Hui Zhou City (CN)

(73) Assignee: PURPLE CLOUD DEVELOPMENT PTE. LTD., Singapore (SG)

( * ) Notice: Subject to any disclaimer, the term of this patent is extended or adjusted under 35 U.S.C. 154(b) by 160 days.

(21) Appl. No.: 18/474,280

(22) Filed: Sep. 26, 2023

(65) Prior Publication Data

US 2024/0110751 A1     Apr. 4, 2024

(30) Foreign Application Priority Data

Sep. 30, 2022    (CN) .......................... 202211215143.5

(51) Int. Cl.
| | |
|---|---|
| *F28D 15/02* | (2006.01) |
| *F28D 15/04* | (2006.01) |
| *F25J 1/00* | (2006.01) |
| *H01L 23/427* | (2006.01) |
| *H05K 7/20* | (2006.01) |

(52) U.S. Cl.
CPC ....... *F28D 15/0233* (2013.01); *F28D 15/046* (2013.01); *F25J 1/0025* (2013.01); *H01L 23/427* (2013.01); *H05K 7/20336* (2013.01)

(58) Field of Classification Search
CPC ... F25J 1/0025; F28D 15/0233; F28D 15/046; H01L 23/427; H05K 7/20336

USPC ..................................................... 165/104.26
See application file for complete search history.

(56) References Cited

U.S. PATENT DOCUMENTS

| | | | | |
|---|---|---|---|---|
| 4,640,347 A | * | 2/1987 | Grover ................. | F28D 15/025 |
| | | | | 165/104.21 |
| 7,137,442 B2 | * | 11/2006 | Kawahara ........... | F28D 15/0233 |
| | | | | 165/104.21 |
| 2012/0279687 A1 | * | 11/2012 | Meyer, IV ............ | F28D 15/046 |
| | | | | 165/104.26 |
| 2013/0213612 A1 | * | 8/2013 | Wu ........................ | F28D 15/046 |
| | | | | 165/104.26 |
| 2018/0306523 A1 | * | 10/2018 | Sasaki ................... | F28D 15/046 |

* cited by examiner

*Primary Examiner* — Joel M Attey
(74) *Attorney, Agent, or Firm* — Merchant & Gould P.C.

(57) ABSTRACT

A thin heat pipe including a thin heat pipe container, wick structure, working fluid, and vapor flow passage section is provided. The thin heat pipe container includes a lower inner wall and upper inner wall. The wick structure is disposed on the lower inner wall and includes a first wick structure portion connected to a second wick structure portion. The vapor flow passage section is configured for vapor to flow therethrough. A thickness of the second wick structure portion is lesser than a thickness of the first wick structure portion and the second wick structure portion does not contact, contact points between the upper inner wall and lower inner wall. The wick structure defines the vapor flow passage section. The first wick structure contacts the upper inner wall and second wick structure. Working fluid is pulled from vapor condenser sections to high temperature sections via the wick structure.

20 Claims, 7 Drawing Sheets

THIN HEAT PIPE WITH SINTERED POWDERED WICK STRUCTURE

RELATED APPLICATIONS

This US application claims the benefit of priority to China application no. 202211215143.5, filed on Sep. 30, 2022, of which is incorporated herein by reference in its entirety.

TECHNICAL FIELD

The present disclosure is related to the field of heat transfer in general and more particularly but not limited to thin heat pipes with sintered powder wick structures.

BACKGROUND OF THE INVENTION

Thin heat pipes can be used for thermal control of compact electronic devices with high heat flux and limited space. Heat pipes are passive two-phase heat transfer devices using evaporation and condensation cycles of working fluid to move heat from a heat source on the electronics device to a location spaced away from the heat source, and to quickly cool the heat source, and in turn, the electronics device. Heat pipes can include wick structures disposed within the heat pipes to facilitate movement (e.g., capillary force) of working fluid within the heat pipes, particularly movement of the working fluid from condenser sections of the heat pipes to evaporator sections of the heat pipes.

The thermal performance of heat pipes having a wick structure is influenced by induced pressure gradients working to force vapor flow toward the condenser section and capillary liquid flow back toward the evaporator sections. Sintered metal powder capillary structures adhere to inner walls of the heat pipes with high contact, reducing heat resistance between the wick structure and the inner walls of the heat pipes.

Generally, a high capillary pressure differential may be achieved with smaller pore radius'. However, accommodation for drops in liquid pressure and higher heat flux transfer may be achieved with larger pore radius'. Determination of the optimal wick structure shape, pore radius', and size and amount of vapor flow passage sections, to facilitate working fluid in a saturated vapor phase to flow towards cooler vapor condenser sections and facilitate working fluid to be pulled from the vapor condenser sections to the evaporator sections, preventing drying out of the working fluid and resulting in high thermal performance of thin heat pipes continue to be a challenge.

SUMMARY OF THE INVENTION

The present disclosure provides a thin heat pipe including a thin heat pipe container, a wick structure, a working fluid, and at least a vapor flow passage section configured for vapor to flow therethrough. The wick structure is disposed only on a lower inner wall of the thin heat pipe container to minimize thickness of the thin heat pipe. A thickness of at least a second wick structure portion of the wick structure is lesser than a thickness of at least a first wick structure portion of the wick structure and the at least a second wick structure portion does not contact, contact points between an upper inner wall of the thin heat pipe container and the lower inner wall to increase an area of the at least a vapor flow passage section, facilitating the working fluid at high temperature sections (or evaporator sections) of the thin heat pipe in a saturated vapor phase to flow towards cooler vapor condensation sections (or condenser sections) of the thin heat pipe. The first wick structure is in contact with the upper inner wall and in contact with the lesser thickness second wick structure to facilitate working fluid to be pulled from the vapor condensation sections to the high temperature sections, preventing drying out of the working fluid when the working fluid is in a liquid phase at the high temperature sections.

In at least one embodiment, the thin heat pipe includes a thin heat pipe container, a wick structure, and a working fluid. The thin heat pipe container is sealed and includes a lower inner wall, an upper inner wall, a central axis, and a longitudinal center plane. The lower inner wall has a main area portion, a first contact area portion, and a second contact area portion. The lower inner wall is longitudinal along a length of the thin heat pipe container. The main area portion is longitudinal along the length of the thin heat pipe container between the first contact area portion on one side of the main area portion and the second contact area portion on an opposite side of the main area portion. The upper inner wall is longitudinal along the length of the thin heat pipe container and opposite the lower inner wall. A center of the longitudinal center plane is defined by the central axis. The longitudinal center plane intersects walls of the thin heat pipe container and define contact points between the upper inner wall and the lower inner wall. The upper inner wall is in contact with the lower inner wall at the first contact area portion and the second contact area portion, respectively. The working fluid is sealed within the lower inner wall and upper inner wall. The wick structure is formed on the main area portion. The wick structure includes at least a first wick structure portion having a first maximum thickness and at least a second wick structure portion having a second maximum thickness. The at least a first wick structure is in contact with the at least a second wick structure and both are disposed longitudinal along the length of the main area portion. The first maximum thickness is greater than the second maximum thickness. The wick structure is not formed on the first contact area portion and the wick structure is not formed on the second contact area portion. The at least a first wick structure contacts the upper inner wall at the first maximum thickness and the at least a second wick structure does not contact the upper inner wall. A capillary force of the at least a first wick structure is greater than a capillary force of the at least a second wick structure. In at least one embodiment, the wick structure is made of sintered metal powder.

In at least one embodiment, a cross-sectional shape of the at least a first wick structure portion is a semielliptical shape. In at least one embodiment, a cross-sectional shape of the at least a second wick structure portion is a semielliptical shape. In at least one embodiment, an amount of the at least a second wick structure portion is two and one of the at least a second wick structure portion is disposed longitudinal along the length of one side of the at least a first wick structure portion and an other of the at least a second wick structure portion is disposed longitudinal along the length of an opposite side of the at least a first wick structure portion.

In at least one embodiment, a cross-sectional shape of the at least a first wick structure portion is a semielliptical shape and a cross-sectional shape of the at least a second wick structure portion is a flat top shape. In at least one embodiment, an amount of the at least a first wick structure portion is two and an amount of the at least a second wick structure portion is one, and one of the at least a first wick structure portion is disposed longitudinal along the length of one side of the at least a second wick structure portion and an other of the at least a first wick structure portion is disposed longitudinal along the length of an opposite side of the at least a second wick structure portion.

In at least one embodiment, a cross-sectional shape of the at least a first wick structure portion is a semielliptical shape and a cross-sectional shape of the at least a second wick structure portion is a vert ramp shape. In at least one embodiment, an amount of the at least a first wick structure portion is three and an amount of the at least a second wick structure portion is four. The at least a first wick structure portion and the at least a second wick structure portion are alternatingly disposed longitudinal along the length of the lower inner wall, beginning with a partial end of one of the at least a second wick structure and ending with an opposite partial end of an other of the at least a second wick structure.

In at least one embodiment, the thin heat pipe further includes at least a vapor flow passage section configured for vapor to flow therethrough, wherein an edge of the at least a second wick structure does not contact, contact points between the upper inner wall and the lower inner wall, to increase an area of the at least a vapor flow passage section.

In at least one alternative embodiment, the thin heat pipe includes a thin heat pipe container, a wick structure, and a working fluid. The thin heat pipe container is sealed and includes a condenser section, an evaporator section, a central axis, and a longitudinal center plane. The evaporator section has a lower inner wall and an upper inner wall. The condenser section has a condenser lower inner wall and a condenser upper inner wall. The lower inner wall has a main area portion, a first contact area portion, and a second contact area portion. The upper inner wall is connected to the lower inner wall and define a first length. The condenser lower inner wall has a condenser main area portion, a condenser first contact area portion, and a condenser second contact area portion. The condenser upper inner wall is connected to the condenser lower inner wall and define a second length. One end of the evaporator section is in contact with one end of the condenser section and both are longitudinal along a length of the thin heat pipe container. The main area portion is longitudinal along the first length between the first contact area portion on one side of the main area portion and the second contact area portion on an opposite side of the main area portion. The upper inner wall is longitudinal along the first length and opposite the lower inner wall. The condenser main area portion is longitudinal along the second length between the condenser first contact area portion on one side of the condenser main area portion and the condenser second contact area portion on an opposite side of the condenser main area portion. The condenser upper inner wall is longitudinal along the second length and opposite the condenser lower inner wall. A center of the longitudinal center plane is defined by the central axis. The longitudinal center plane intersects walls of the thin heat pipe container and define contact points between the upper inner wall and the lower inner wall, and define contact points between the condenser upper inner wall and the condenser lower inner wall. The upper inner wall is in contact with the lower inner wall at the first contact area portion and the second contact area portion, respectively. The condenser upper inner wall is in contact with the condenser lower inner wall at the condenser first contact area portion and the condenser second contact area portion, respectively. The working fluid is sealed within the lower inner wall and the upper inner wall and the condenser lower inner wall and the condenser upper inner wall, respectively. The wick structure is formed on the main area portion. The wick structure includes at least a first wick structure portion having a first maximum thickness and at least a second wick structure portion having a second maximum thickness. The at least a first wick structure is in contact with the at least a second wick structure and both are disposed longitudinal along the first length. The first maximum thickness is greater than a second maximum thickness. The wick structure is not formed on the first contact area portion and the wick structure is not formed on the second contact area portion. The at least a first wick structure contacts the upper inner wall at the first maximum thickness and the at least a second wick structure does not contact the upper inner wall. A capillary force of the at least a first wick structure is greater than a capillary force of the at least a second wick structure. In at least one alternative embodiment, the wick structure is made of sintered metal powder. In at least one alternative embodiment, the second length is equal to or greater than the first length. In at least one alternative embodiment, the first length is at least 10 centimeters or greater.

In at least one alternative embodiment, the thin heat pipe further includes a condenser wick structure. The condenser wick structure is formed on the condenser main area portion. The condenser wick structure has at least a third wick structure portion having a third maximum thickness, and at least a fourth wick structure portion having a fourth maximum thickness. The at least a third wick structure is in contact with the at least a fourth wick structure and both are disposed longitudinal along the second length. One end of the at least a first wick structure is in contact with one end of the at least a third wick structure and one end of the at least a second wick structure is in contact with one end of the at least a fourth wick structure. The third maximum thickness is greater than the fourth maximum thickness. The condenser wick structure is not formed on the condenser first contact area portion and the condenser wick structure is not formed on the condenser second contact area portion. The at least a third wick structure contacts the condenser upper inner wall at the third maximum thickness and the at least a fourth wick structure does not contact the condenser upper inner wall. A capillary force of the at least a third wick structure is greater than a capillary force of the at least a fourth wick structure. A capillary force of the at least a first wick structure is lesser than a capillary force of the at least a third wick structure. A capillary force of the at least a second wick structure is lesser than a capillary force of the at least a fourth wick structure.

In at least one alternative embodiment, a cross-sectional shape of the at least a first wick structure portion, a cross-sectional shape of the at least a second wick structure portion, a cross-sectional shape of the at least a third wick structure portion, and a cross-sectional shape of the at least a fourth wick structure portion are semielliptical shapes. In at least one alternative embodiment, an amount of the at least a second wick structure portion is two and an amount of the at least a fourth wick structure is two. One of the at least a second wick structure portion is disposed longitudinal along the length of one side of the at least a first wick structure portion and an other of the at least a second wick structure portion is disposed longitudinal along the length of an opposite side of the at least a first wick structure portion. One of the at least a fourth wick structure portion is disposed longitudinal along the length of one side of the at least a third wick structure portion and an other of the at least a fourth wick structure portion is disposed longitudinal along the length of an opposite side of the at least a third wick structure portion.

In at least one alternative embodiment, the thin heat pipe further includes at least a vapor flow passage section configured for vapor to flow therethrough, wherein an edge of the at least a second wick structure does not contact, contact points between the upper inner wall and the lower inner wall, and an edge of the at least a fourth wick structure does not contact, contact points between the condenser upper inner wall and the condenser lower inner wall, to increase an area of the at least a vapor flow passage section.

In at least one alternative embodiment, the mesh count of the wick structure is greater than the mesh count of the condenser wick structure, and the capillary force of the at least a first wick structure is lesser than the capillary force of the at least a third wick structure, and the capillary force of the at least a second wick structure is lesser than the capillary force of the at least a fourth wick structure, so that the working fluid is pulled from the third wick structure to the first wick structure, and the working fluid is pulled from the at least a fourth wick structure to the at least a second wick structure. In at least one alternative embodiment, a mesh count of the wick structure is between 100 mesh and 120 mesh, inclusive, and a mesh count of the condenser wick structure is between 60 mesh and 80 mesh, inclusive.

BRIEF DESCRIPTION OF DRAWINGS

Unless specified otherwise, the accompanying drawings illustrate aspects of the innovative subject matter described herein. Referring to the drawings, wherein like reference numerals indicate similar parts throughout the several views, several examples of thin heat pipes incorporating aspects of the presently disclosed principles are illustrated by way of example, and not by way of limitation.

DETAILED DESCRIPTION

The following describes various principles related to thermal control of compact electronic devices by way of reference to specific examples of thin heat pipes, including specific arrangements and examples of thin heat pipe containers, and wick structures embodying innovative concepts. More particularly, but not exclusively, such innovative principles are described in relation to selected examples of wick structures and how their shapes and disposition within thin heat pipes can influence the capillary force of working fluids and well-known functions or constructions are not described in detail for purposes of succinctness and clarity. Nonetheless, one or more of the disclosed principles can be incorporated in various other embodiments of wick structures to achieve any of a variety of desired outcomes, characteristics, and/or performance criteria.

Thus, thin heat pipes having attributes that are different from those specific examples discussed herein can embody one or more of the innovative principles, and can be used in applications not described herein in detail. Accordingly, embodiments of thin heat pipes not described herein in detail also fall within the scope of this disclosure, as will be appreciated by those of ordinary skill in the relevant art following a review of this disclosure.

Example embodiments as disclosed herein are directed to thin heat pipes which are sealed and in a condition of vacuum, wherein evaporation and condensation cycles of working fluid move heat from a heat source (evaporator section of the heat pipes) on an electronics device to a location spaced away (condenser section of the heat pipes) from the heat source to cool the heat source, and in turn, the electronics device. The working fluid absorbs heat at the evaporator section where the working fluid is then vaporized. The saturated vapor is transported through an adiabatic section (vapor flow passage section of the heat pipes) via a vapor pressure gradient from the temperature at the evaporator section being greater than the temperature at the vapor flow passage section. The heat is then dispersed at the condenser section. After the heat is dispersed, the working fluid is re-circulated to the evaporator section in a liquid phase via a liquid pressure gradient from the temperature at the vapor flow passage section being greater than the temperature at the condenser section. The heat pipes include wick structures disposed within the heat pipes to facilitate movement (e.g., capillary force) of working fluid within the heat pipes, particularly movement of the working fluid from condenser sections to evaporator sections.

The thin heat pipes may be configured within a chassis or as part of an electric or electronics system that includes heat producing components to be cooled.

Figure 1:
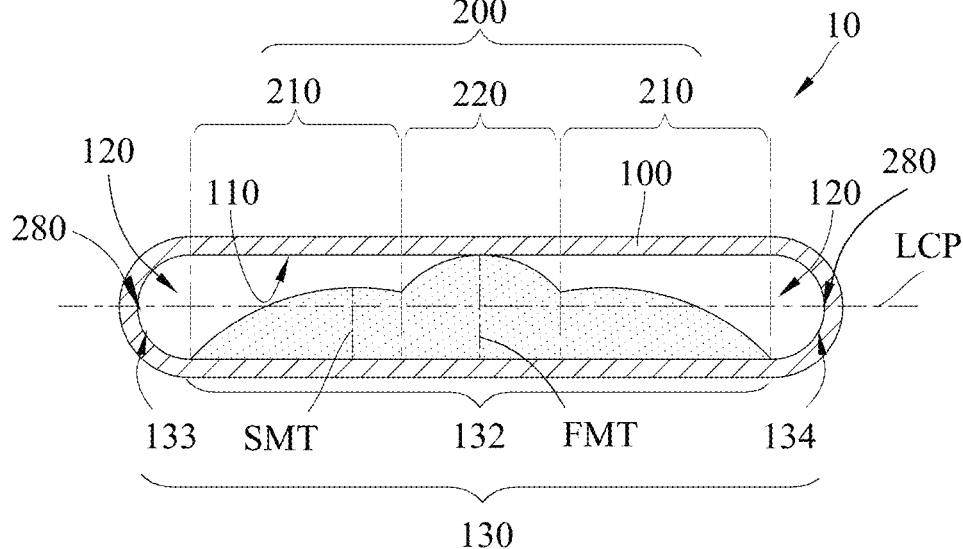
FIG. 1 is a cross-sectional view of a thin heat pipe according to one embodiment of the present disclosure.

FIG. 1 includes at least one embodiment of a thin heat pipe 10. The thin heat pipe 10 includes a thin heat pipe container 100, a wick structure 200, and a working fluid (not shown). The thin heat pipe container 100 is sealed and includes a lower inner wall 130, an upper inner wall 110, a central axis C, and a longitudinal center plane LCP. The lower inner wall 130 has a main area portion 132, a first contact area portion 133, and a second contact area portion 134. The lower inner wall 130 is longitudinal along a length of the thin heat pipe container 100. The main area portion 132 is longitudinal along the length of the thin heat pipe container 100 between the first contact area portion 133 on one side of the main area portion 132 and the second contact area portion 134 on an opposite side of the main area portion 132. The upper inner wall 110 is longitudinal along the length of the thin heat pipe container 100 and opposite the lower inner wall 130. A center of the longitudinal center plane LCP is defined by the central axis C. The longitudinal center plane LCP intersects walls of the thin heat pipe container 100 and define contact points 280 between the upper inner wall 110 and the lower inner wall 130. The upper inner wall 110 is in contact with the lower inner wall 130 at the first contact area portion 133 and the second contact area portion 134, respectively. The working fluid is sealed within the lower inner wall 130 and upper inner wall 110. The wick structure 200 is formed on the main area portion 132 to minimize a thickness of the thin heat pipe 10. The wick structure 200 includes at least a first wick structure portion 220 having a first maximum thickness FMT and at least a second wick structure portion 210 having a second maximum thickness SMT. The at least a first wick structure portion 220 is in contact with the at least a second wick structure portion 210 and both are disposed longitudinal along the length of the main area portion 132. The first maximum thickness FMT is greater than the second maximum thickness SMT. The wick structure 200 is not formed on the first contact area portion 133 and the wick structure 200 is not formed on the second contact area portion 134. The at least a first wick structure portion 220 contacts the upper inner wall 110 at the first maximum thickness FMT and the at least a second wick structure portion 210 does not contact the upper inner wall 110. A capillary force of the at least a first wick structure portion 220 is greater than a capillary force of the at least a second wick structure portion 210. In at least one embodiment, the wick structure 200 is made of sintered metal powder A cross-sectional shape of the thin heat pipe 10 can be a flat oval shape. In at least one embodiment, a cross-sectional shape of the at least a first wick structure portion 220 is a semielliptical shape. In at least one embodiment, a cross-sectional shape of the at least a second wick structure portion 210 is a semielliptical shape. In at least one embodiment, an amount of the at least a second wick structure portion 210 is two and one of the at least a second wick structure portion 210 is disposed longitudinal along the length of one side of the at least a first wick structure portion 220 and an other of the at least a second wick structure portion 210 is disposed longitudinal along the length of an opposite side of the at least a first wick structure portion 220. The cross-sectional shapes of the at least a second wick structure portion 210, the at least a first wick structure portion 220, and the other of the at least a second wick structure portion 210 form a head-and-shoulder-like shape, wherein both of the cross-sectional shapes of the at least a second wick structure portion 210 merge with the cross-sectional shape of the at least a first wick structure portion 220.

FIGS. 2-9 include at least one embodiment of a method to manufacture the thin heat pipe 10 of FIG. 1 before being flattened. To begin, a pre-thin heat pipe container 600 and a mandrel 700 having cut-away portions 730/720 are provided. The cut-away portions 730/720 are along a longitudinal length of the mandrel 700. The pre-thin heat pipe container 600 include an opening 620, a pre-lower inner wall 630, a pre-upper inner wall 610, a central axis C, and a longitudinal center plane LCP. A shape of the pre-thin heat pipe container 600 before being flattened can be a cylindrical shape. A shape of the mandrel 700 can be a solid cylindrical-like shape corresponding to the cylindrical shape of the pre-thin heat pipe container 600. The cut-away portions include at least a first cut-away portion 730 and at least a second cut-away portion 720. A first mandrel thickness of the at least a first cut-away portion 730 is greater than a second mandrel thickness of the at least a second cut-away portion 720. A shape of the at least a first cut-away portion 730 and a shape of the at least a second cut-away portion 720 can be a flat and rectangular shape, respectively. An amount of the at least a first cut-away portion 730 can be one and an amount of the at least a second cut-away portion 720 can be two and the at least a second cut-away portion 720 is in contact with the at least a first cut-away portion 730. One edge of one of the at least a second cut-away portion 720 extends from one edge of the at least a first cut-away portion 730 and one edge of an other of the at least a second cut-away portion 720 extends from an opposite edge of the at least a first cut-away portion 730. Both of the at least a second cut-away portion 720 can extend from opposite edges of the at least a first cut-away portion 730 at an angle. Both of the at least a second cut-away portion 720 can extend from opposite edges of the at least a first cut-away portion 730 at a same angle, respectively.

Next, the mandrel 700 is inserted into the pre-thin heat pipe container 600 so that plane surfaces of only the at least a first cut-away portion 730 and the at least a second cut-away portion 720 define a capillary liquid flow section S of the pre-thin heat pipe container 600. A non-cut-away portion 710 of the mandrel 700 corresponding to the cylindrical shape of the pre-thin heat pipe container 600 is in contact with the entire pre-lower inner wall 630 and at least partially the pre-upper inner wall 610. A first maximum distance D1 is formed between the plane surface of the at least a first cut-away portion 730 and the pre-upper inner wall 610 and a second maximum distance D2 is formed between the plane surface of the at least a second cut-away portion 720 and the pre-upper inner wall 610. The first maximum distance D1 is greater than the second maximum distance D2.

Following, the pre-wick structure 800 is formed by depositing metal powder into the capillary liquid flow section S. Next, the metal powder is sintered and bonded together forming the pre-wick structure 800. The pre-wick structure 800 includes at least a pre-first wick structure portion 820 and at least a pre-second wick structure portion 810. The at least a pre-first wick structure portion 820 correspond to the at least a first cut-away portion 730 and after being flattened, is formed into the at least a first wick structure portion 220. The at least a pre-second wick structure portion 810 correspond to the at least a second cut-away portion 720 and after being flattened, is formed into the at least a second wick structure portion 210. Following, the mandrel 700 is removed, leaving the pre-wick structure 800 behind and disposed longitudinally along the pre-upper inner wall 610 and forming the at least a pre-vapor flow passage section 720. The at least a pre-vapor flow passage section 720 correspond to the mandrel 700 and after being flattened, is formed into the at least a vapor flow passage section 120. Next, the pre-thin heat pipe container 600 having the pre-wick structure 800 and the at least a pre-vapor flow passage section 720 is flattened to form the thin heat pipe 10 of FIG. 1.

Figure 10:
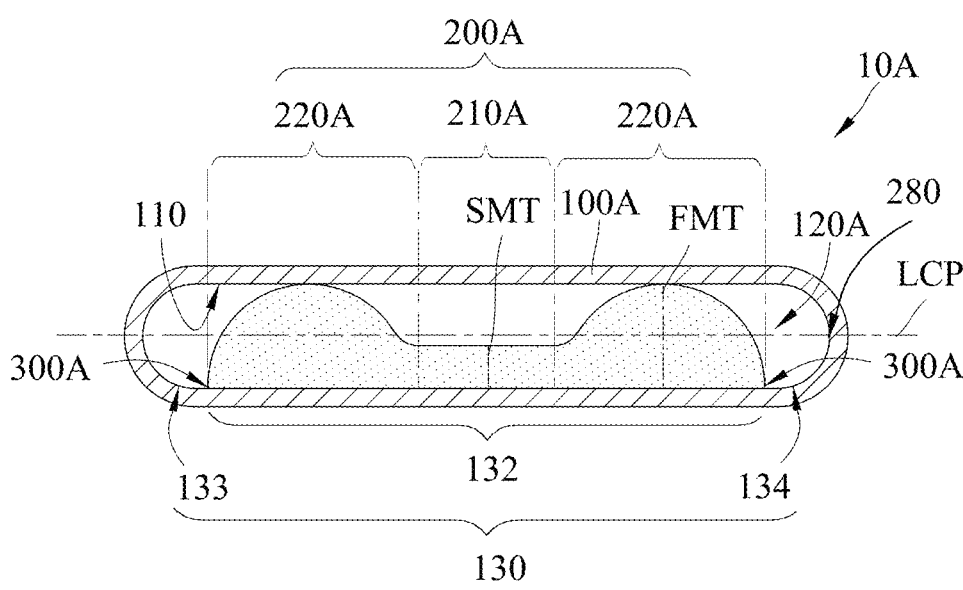
FIG. 10 is a cross-sectional view of an alternative thin heat pipe according to one embodiment of the present disclosure.

FIG. 10 includes at least one alternative embodiment of a thin heat pipe 10A. The thin heat pipe 10A of FIG. 10 may be similar in some respects to the thin heat pipe 10 of FIG. 1, and therefore may be best understood with reference thereto where like numerals designate like components not described again in detail.

A cross-sectional shape of the thin heat pipe 10A can be a flat oval shape. In at least one embodiment, a cross-sectional shape of the at least a first wick structure portion 220A is a semielliptical shape and a cross-sectional shape of the at least a second wick structure 210A portion 210A is a flat top shape. In at least one embodiment, an amount of the at least a first wick structure portion 200A-220A is two and an amount of the at least a second wick structure portion 210B-210A is one, and one of the at least a first wick structure portion 200A-220A is disposed longitudinal along the length of one side of the at least a second wick structure portion 210B-210A and an other of the at least a first wick structure portion 200A-220A is disposed longitudinal along the length of an opposite side of the at least a second wick structure portion 210A. The cross-sectional shapes of the at least a first wick structure portion 220A, the at least a second wick structure portion 210A, and the other of the at least a first wick structure portion 220A form a half dumbbell-like shape, wherein both cross-sectional shapes of the at least a first wick structure portion 220A merge with the cross-sectional shape of the at least a second wick structure portion 210A.

Figure 11:
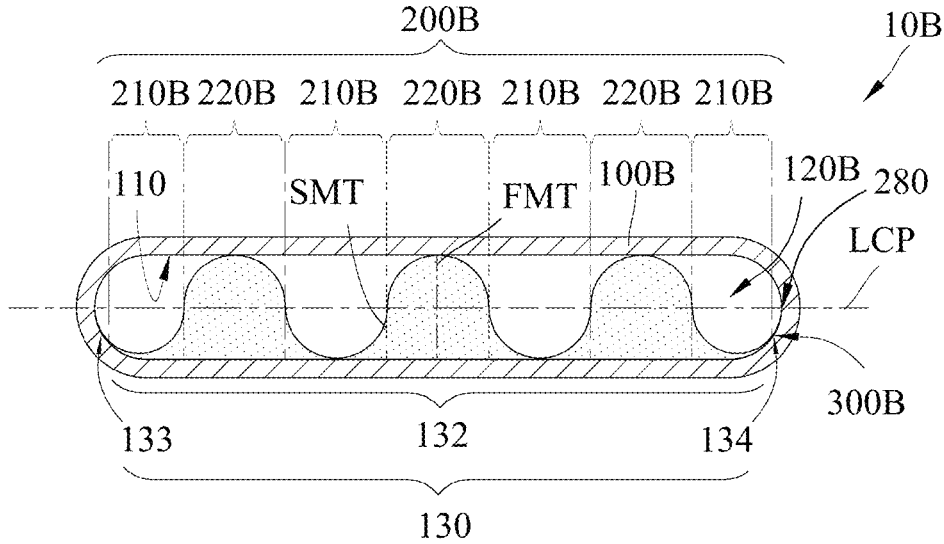
FIG. 11 is a cross-sectional view of another alternative thin heat pipe according to one embodiment of the present disclosure.

FIG. 11 includes at least another alternative embodiment of a thin heat pipe 10B. The thin heat pipe 10B of FIG. 11 may be similar in some respects to the thin heat pipe 10 of FIG. 1, and therefore may be best understood with reference thereto where like numerals designate like components not described again in detail. A cross-sectional shape of the thin heat pipe 10B can be a flat oval shape. In at least one embodiment, a cross-sectional shape of the at least a first wick structure portion 200B-220B is a semielliptical shape and a cross-sectional shape of the at least a second wick structure 210B portion is a vert ramp shape. In at least one embodiment, an amount of the at least a first wick structure portion 220B is three and an amount of the at least a second wick structure portion 210B is four. The at least a first wick structure portion 220B and the at least a second wick structure portion 210B are alternatingly disposed longitudinal along the length of the lower inner wall 130, beginning with one of the at least a second wick structure portion 210B and ending with an other of the at least a second wick structure portion 210B. The cross-sectional shapes of the at least a second wick structure portion 210B and the at least a first wick structure portion 220B form a wavy hill-like shape, wherein the four cross-sectional shapes of the at least a second wick structure portion 210B merge with the three cross-sectional shapes of the at least a first wick structure portion 220B, alternatingly.

In at least two embodiments, the thin heat pipes 10A/10B further include at least a vapor flow passage section 120A/120B configured for vapor to flow therethrough, wherein an edge 300A/300B of the at least a second wick structure 210A/210B does not contact, contact points 280 between the upper inner wall 110 and the lower inner wall 130, to increase an area of the at least a vapor flow passage section 120A/120B, facilitating the working fluid in a saturated vapor phase, carrying latent vaporization heat from high temperature sections (or evaporator sections) of the thin heat pipe 10A/10B, to flow towards cooler vapor condensation sections (or condenser section) of the thin heat pipe 10A/10B.

In at least one embodiment, the thin heat pipe 10A further includes at least a vapor flow passage section 120A configured for vapor to flow therethrough, wherein an edge of the at least a first wick structure portion 220A does not contact the contact points 280 between the upper inner wall 110 and the lower inner wall 130, to increase an area of the at least a vapor flow passage section 120A, facilitating the working fluid in a saturated vapor phase, carrying latent vaporization heat from high temperature sections (or evaporator sections) of the thin heat pipe 10A to flow towards cooler vapor condensation sections (or condenser section) of the thin heat pipe 10A.

In the embodiments, the method to manufacture the alternative thin heat pipe 10A of FIG. 10 and the another alternative thin heat pipe 10B of FIG. 11 may be similar in some respects to the thin heat pipe 10 of FIG. 1 before being flattened, and therefore may be best understood with reference thereto, and will not be not described again in detail. Generally, amounts, shapes, and thicknesses of the at least a first cut-away portion 730 and the at least a second cut-away portion 720 are adjusted so that the at least a pre-first wick structure portions and the at least a pre-second wick structure portions, after being flattened, correspond to the at least a first wick structure portion 220A and the at least a second wick structure portion 210A of the thin heat pipe 10A of FIG. 10 and the at least a first wick structure portion 220B and the at least a second wick structure portion 210B of the thin heat pipe 10B of FIG. 11, respectively.

Figure 2:
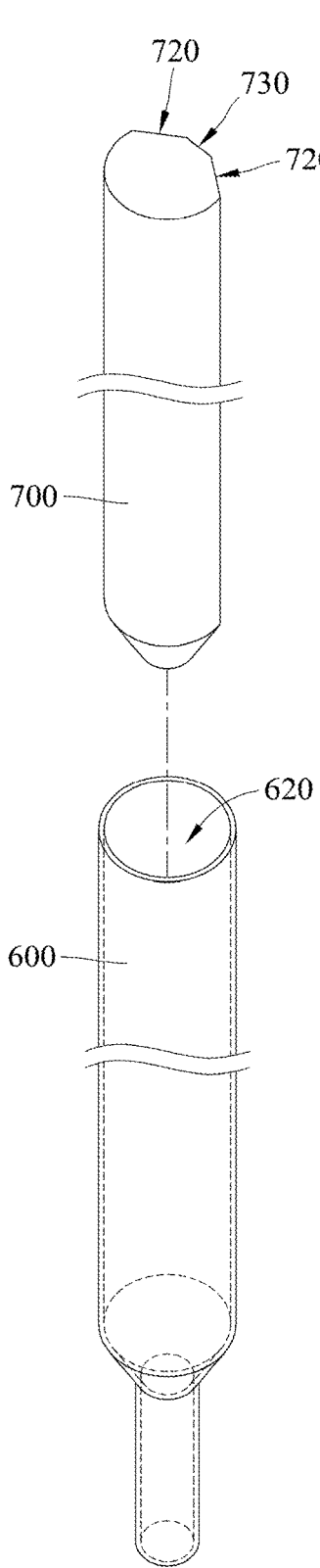
FIG. 2 is a perspective of a mandrel having cut-away portions before being disposed within a hollow interior of a thin heat pipe container of the thin heat pipe of FIG. 1 before being flattened and an interior view of the thin heat pipe container according to one embodiment of the present disclosure.
Figure 3:
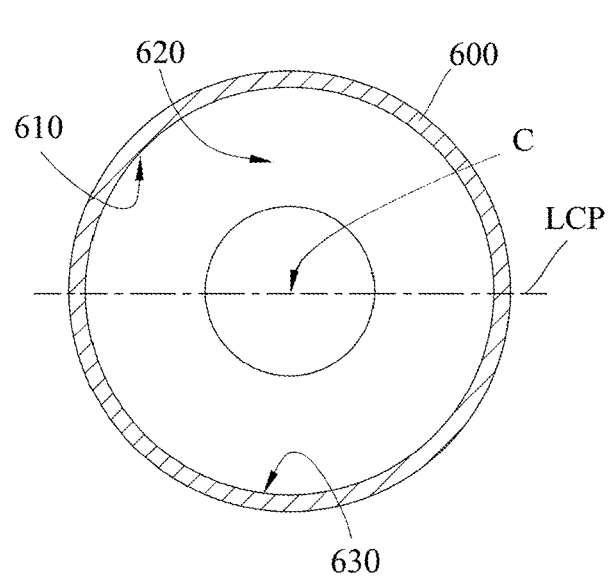
FIG. 3 is a cross-sectional view of the thin heat pipe container of FIG. 2 according to one embodiment of the present disclosure.
Figures 4, 5:
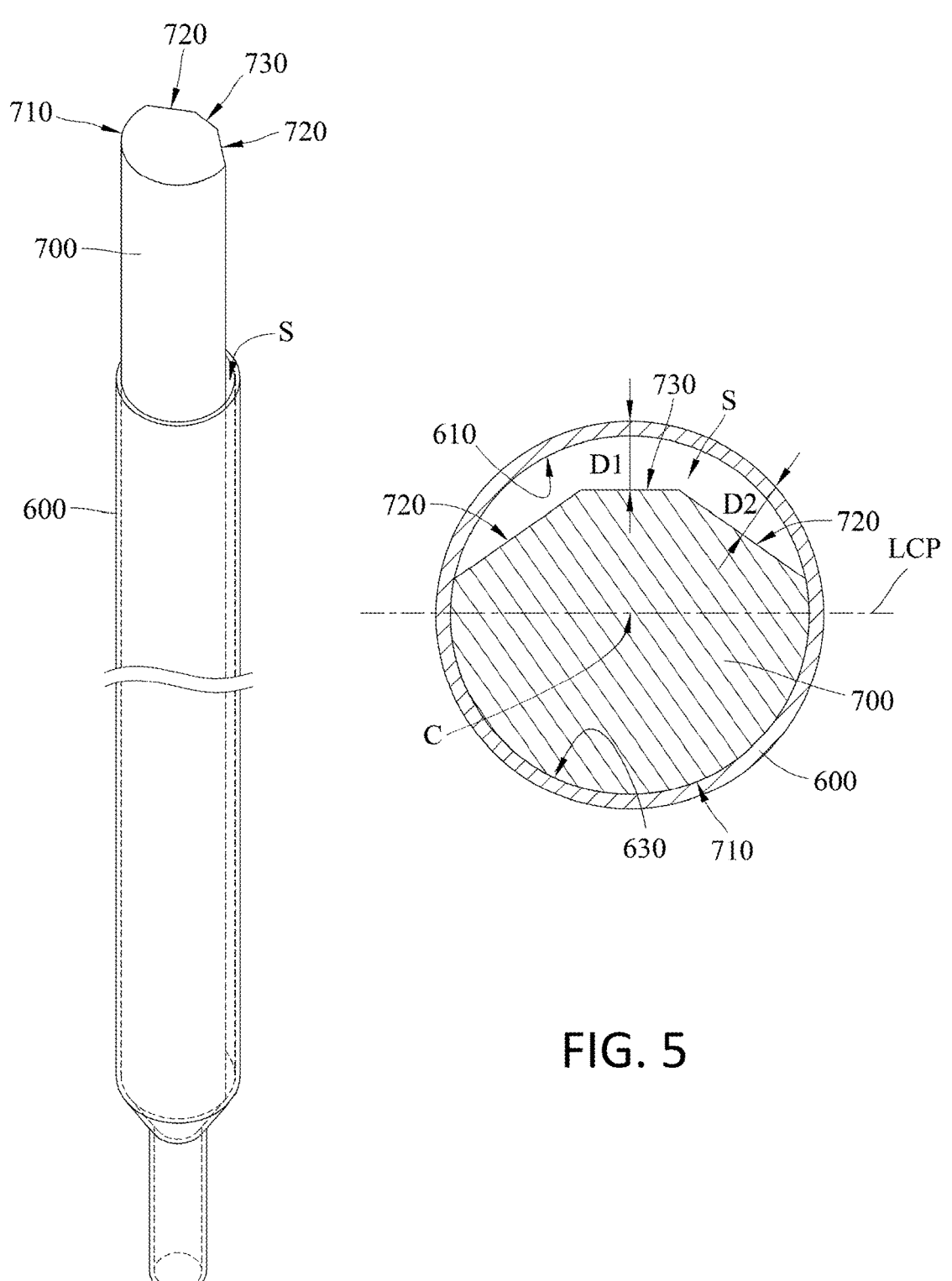
FIG. 4 is a partially perspective view and an interior view of the mandrel disposed within the thin heat pipe container of FIG. 2 according to one embodiment of the present disclosure.
FIG. 5 is a cross-sectional view of the mandrel disposed within the thin heat pipe container of FIG. 4 according to one embodiment of the present disclosure.
Figures 6, 7:
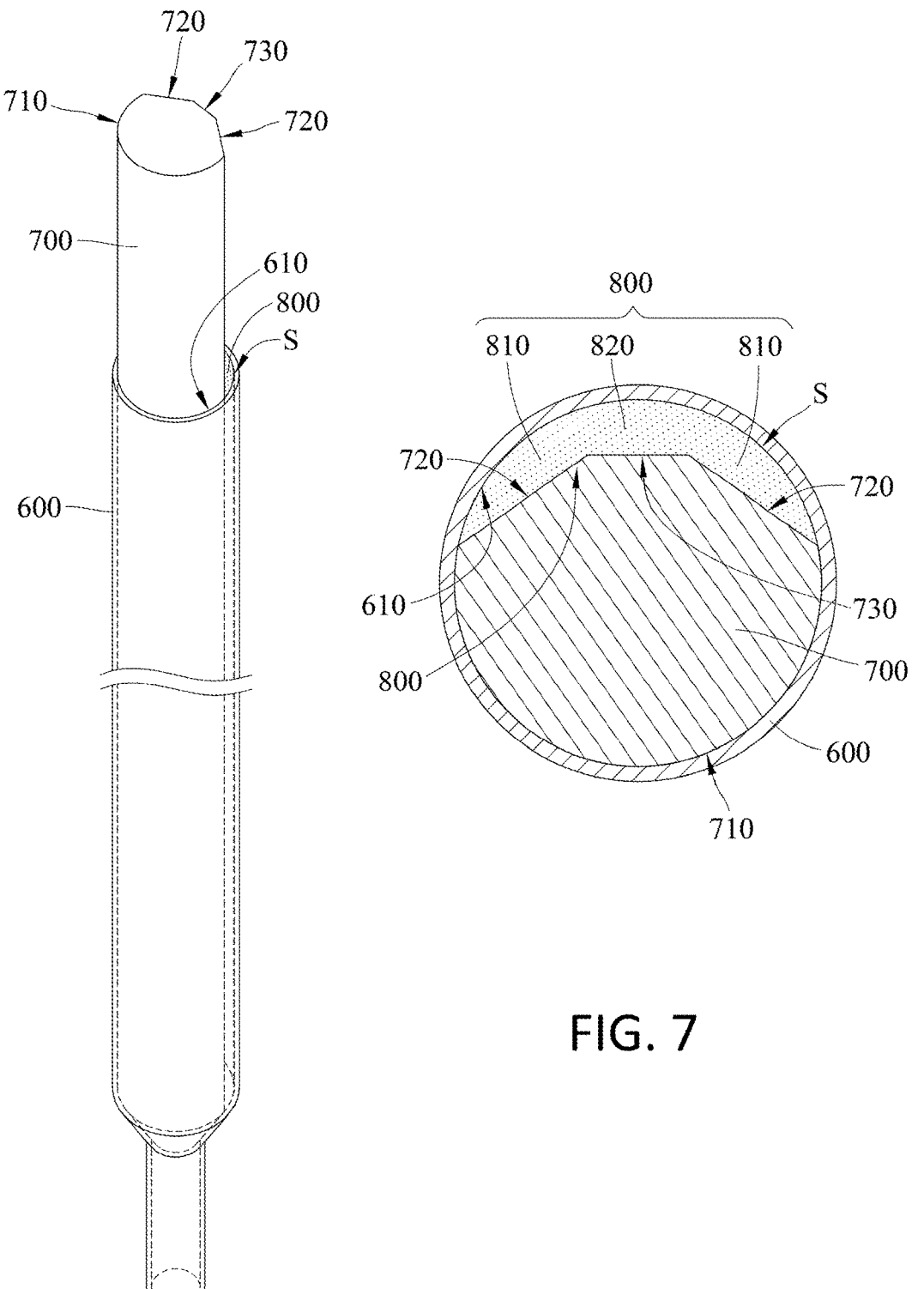
FIG. 6 is a partially perspective view and an interior view of the mandrel disposed within the thin heat pipe container of FIG. 4 and a wick structure disposed in a capillary liquid flow section of a thin heat pipe container of the thin heat pipe of FIG. 1 before being flattened according to one embodiment of the present disclosure.
FIG. 7 is a cross-sectional view of the mandrel disposed within the thin heat pipe container and the wick structure disposed in the capillary liquid flow section of the thin heat pipe of FIG. 6 according to one embodiment of the present disclosure.
Figures 8, 9:
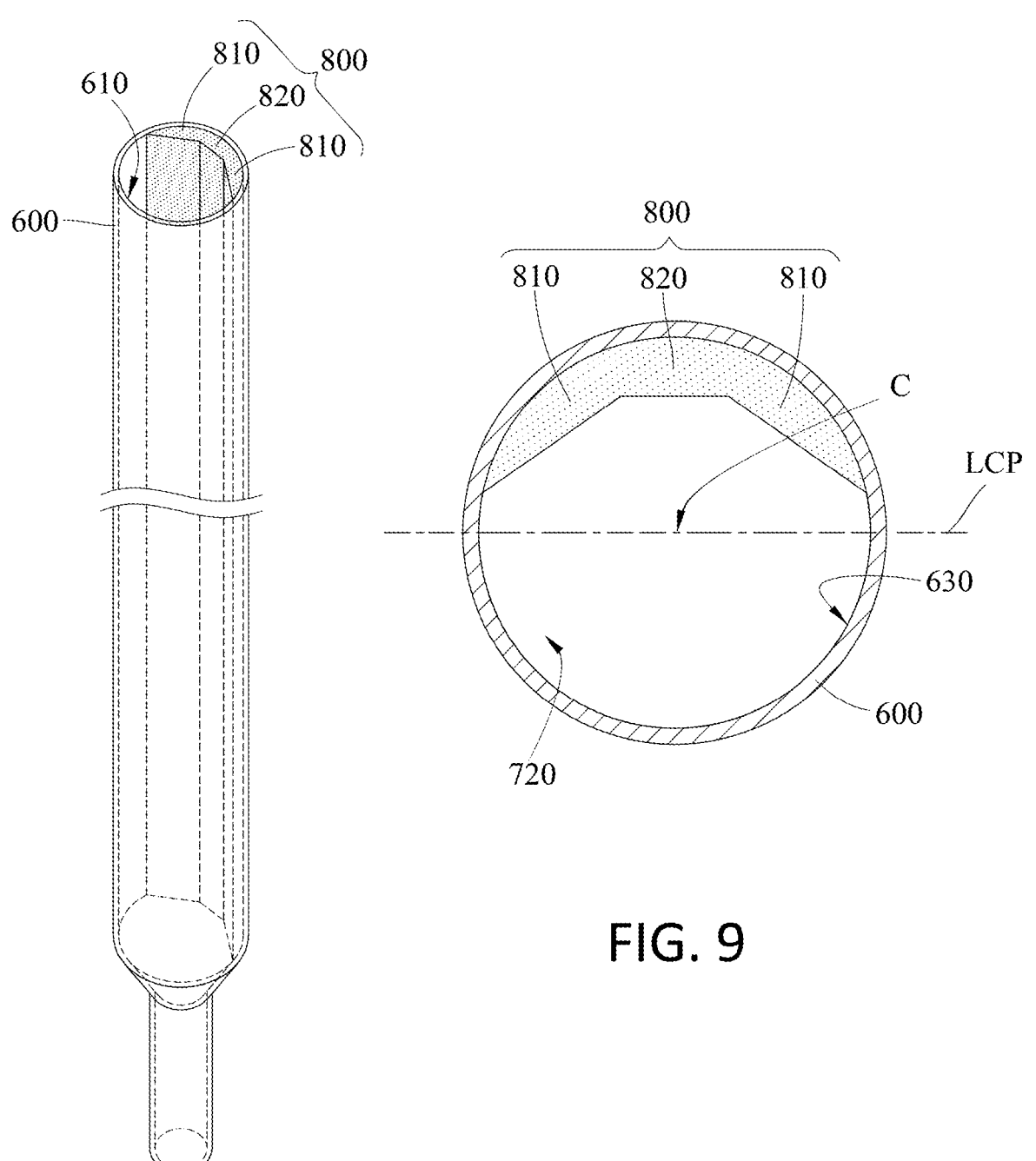
FIG. 8 is an interior view of the wick structure disposed in the capillary liquid flow section of the thin heat pipe of FIG. 1 before being flattened according to one embodiment of the present disclosure.
FIG. 9 is a cross-sectional view of the wick structure disposed in the capillary liquid flow section of the thin heat pipe of FIG. 8 according to one embodiment of the present disclosure.
Figures 12, 13:
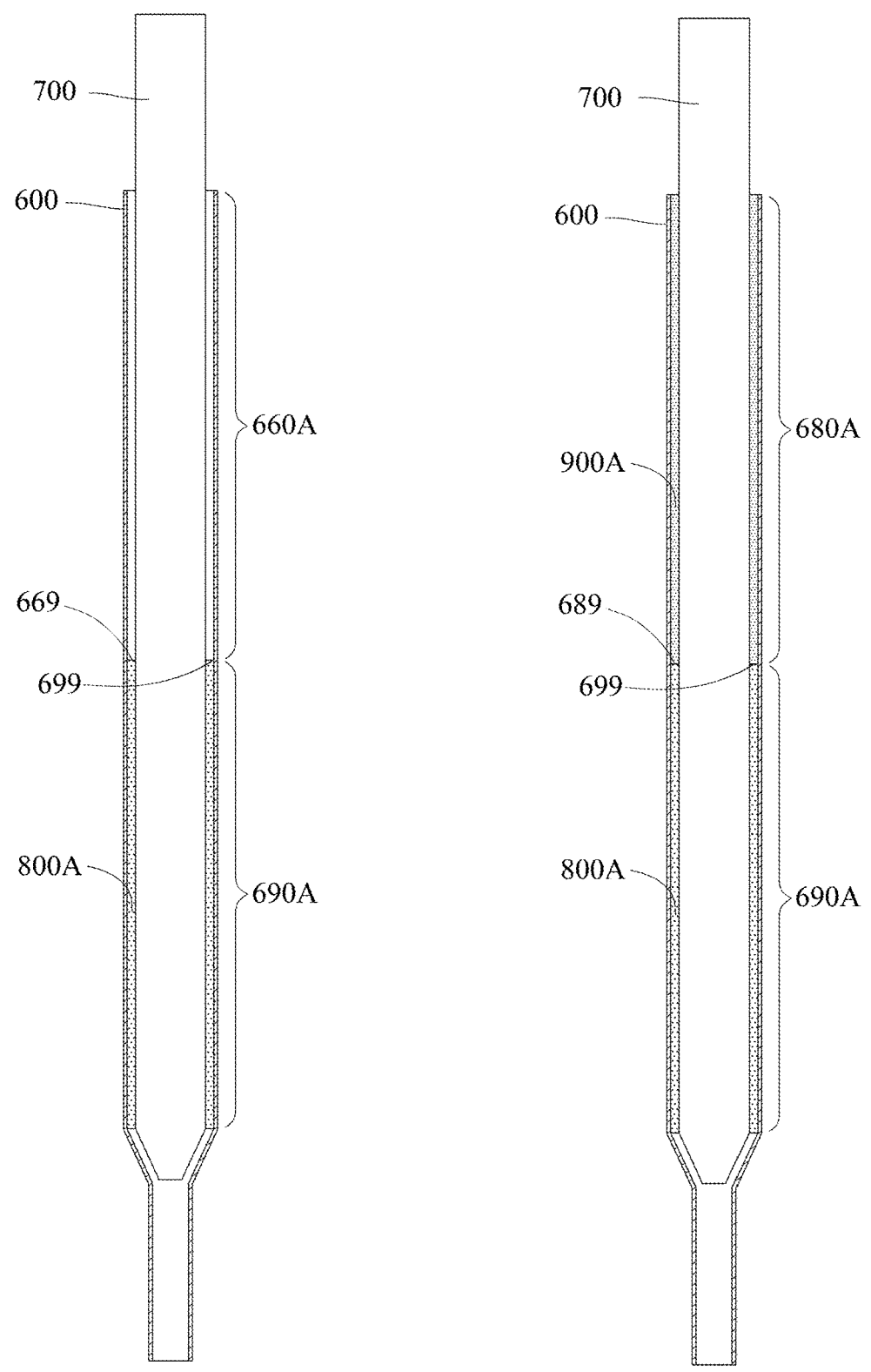
FIG. 12 is a cross-sectional view of the mandrel of FIG. 2 disposed within a thin heat pipe container of a yet another alternative thin heat pipe and a wick structure disposed in a capillary liquid flow section of the thin heat pipe container before being flattened according to one embodiment of the present disclosure.
FIG. 13 is a cross-sectional view of the mandrel of FIG. 2 disposed within a thin heat pipe container of further yet another alternative thin heat pipe and a wick structure and a condenser wick structure disposed in a capillary liquid flow section of the thin heat pipe container before being flattened according to one embodiment of the present disclosure.

FIG. 12 is a cross-sectional view of the mandrel 700 of FIG. 2 disposed within the pre-thin heat pipe container 600 of yet another alternative thin heat pipe and a pre-wick structure disposed in the capillary liquid flow section S of the pre-thin heat pipe container 600 before being flattened according to one embodiment of the present disclosure. In at least one embodiment, the mandrel 700, disposed within the pre-thin heat pipe container 600, and the pre-wick structure, disposed in the capillary liquid flow section S of the pre-thin heat pipe container 600 before being flattened, may be similar in some respects to the mandrel 700 disposed within the pre-thin heat pipe container 600 and the wick structure 800 disposed in the capillary liquid flow section S of the pre-thin heat pipe container 600 of the thin heat pipe 10 of FIG. 1 before being flattened, and therefore may be best understood with reference thereto, and will not be not described again in detail. The pre-wick structure further includes at least a pre-first wick structure portion 800A. The pre-wick structure corresponds to the cut-away portions 720/730/720 of the mandrel 700, and after being flattened, is formed into the wick structure 800. The pre-wick structure is disposed longitudinally along the pre-upper inner wall 610 and form the at least a pre-vapor flow passage section 720. The at least a pre-vapor flow passage section 720 correspond to the mandrel 700 and after being flattened, is formed into the at least a vapor flow passage section 120. The at least a pre-first wick structure portion 800A define a first length and define a pre-evaporator section 690A. The first length is less than a length of the pre-thin heat pipe container 600. A pre-condenser section 660A is defined by a second length of the pre-thin heat pipe container 600.

The yet another alternative thin heat pipe includes a thin heat pipe container, a wick structure, and a working fluid. The thin heat pipe container is sealed and includes a condenser section defined by the pre-condenser section 660A, an evaporator section defined by the pre-evaporator section 690A, a central axis, and a longitudinal center plane. The evaporator section has a lower inner wall and an upper inner wall. The condenser section has a condenser lower inner wall and a condenser upper inner wall. The lower inner wall has a main area portion, a first contact area portion, and a second contact area portion. The upper inner wall is connected to the lower inner wall and is defined by the first length. The condenser lower inner wall has a condenser main area portion, a condenser first contact area portion, and a condenser second contact area portion. The condenser upper inner wall is connected to the condenser lower inner wall and is defined by the second length. One end of the evaporator section, corresponding to one end 699 of the pre-evaporator section 690A, is in contact with one end of the condenser section, corresponding to one end 669 of the pre-condenser section 660A, and both, the evaporator section and the condenser section, are longitudinal along a length of the pre-thin heat pipe container 600. The main area portion is longitudinal along the first length between the first contact area portion on one side of the main area portion and the second contact area portion on an opposite side of the main area portion. The upper inner wall is longitudinal along the first length and opposite the lower inner wall. The condenser main area portion is longitudinal along the second length between the condenser first contact area portion on one side of the condenser main area portion and the condenser second contact area portion on an opposite side of the condenser main area portion. The condenser upper inner wall is longitudinal along the second length and opposite the condenser lower inner wall. A center of the longitudinal center plane is defined by the central axis. The longitudinal center plane intersects walls of the thin heat pipe container and define contact points between the upper inner wall and the lower inner wall, and define contact points between the condenser upper inner wall and the condenser lower inner wall. The upper inner wall is in contact with the lower inner wall at the first contact area portion and the second contact area portion, respectively. The condenser upper inner wall is in contact with the condenser lower inner wall at the condenser first contact area portion and the condenser second contact area portion, respectively. The working fluid is sealed within the lower inner wall and the upper inner wall and the condenser lower inner wall and the condenser upper inner wall, respectively. The wick structure is formed on the main area portion to minimize a thickness of the thin heat pipe. The wick structure includes at least a first wick structure portion having a first maximum thickness and at least a second wick structure portion having a second maximum thickness. The at least a first wick structure is in contact with the at least a second wick structure and both are disposed longitudinal along the first length. The first maximum thickness is greater than a second maximum thickness. The wick structure is not formed on the first contact area portion and the wick structure is not formed on the second contact area portion. The at least a first wick structure contacts the upper inner wall at the first maximum thickness and the at least a second wick structure does not contact the upper inner wall. A capillary force of the at least a first wick structure is greater than a capillary force of the at least a second wick structure.

FIG. 13 is a cross-sectional view of the mandrel 700 of FIG. 2 disposed within the pre-thin heat pipe container 600 of further yet another alternative thin heat pipe and a pre-wick structure disposed in the capillary liquid flow section S of the pre-thin heat pipe container 600 before being flattened according to one embodiment of the present disclosure. In at least one embodiment, the mandrel 700, disposed within the pre-thin heat pipe container 600, and the pre-wick structure, disposed in the capillary liquid flow section S of the pre-thin heat pipe container 600 before being flattened, may be similar in some respects to the mandrel 700 disposed within the pre-thin heat pipe container 600 and the wick structure 800 disposed in the capillary liquid flow section S of the pre-thin heat pipe container 600 of the thin heat pipe 10 of FIG. 1 before being flattened, and the at least a pre-first wick structure 800A defining the pre-evaporator section 690A of FIG. 12, and therefore may be best understood with reference thereto, and will not be not described again in detail. The pre-wick structure further includes at least a pre-second wick structure portion 900A. The pre-wick structure corresponds to the cut-away portions 720/730/720 of the mandrel 700, and after being flattened, is formed into the wick structure 800. The pre-wick structure is disposed longitudinally along the pre-upper inner wall 610 and form the at least a pre-vapor flow passage section 720. The at least a pre-vapor flow passage section 720 correspond to the mandrel 700 and after being flattened, is formed into the at least a vapor flow passage section 120. The at least a pre-second wick structure portion 900A is defined by the second length and define a pre-condenser section 680A. The second length is less than a length of the pre-thin heat pipe container 600. The pre-evaluator section 690A is defined by the first length of the pre-thin heat pipe container 600.

The further yet another alternative thin heat pipe further includes a condenser wick structure. The condenser wick structure is defined by the pre-condenser wick structure 900A before being flattened and is formed on the condenser main area portion. The condenser wick structure has at least a third wick structure portion having a third maximum thickness, and at least a fourth wick structure portion having a fourth maximum thickness. The at least a third wick structure is in contact with the at least a fourth wick structure and both are disposed longitudinal along the second length. One end of the at least a first wick structure is in contact with one end of the at least a third wick structure and one end of the at least a second wick structure is in contact with one end of the at least a fourth wick structure. The third maximum thickness is greater than the fourth maximum thickness. The condenser wick structure is not formed on the condenser first contact area portion and the condenser wick structure is not formed on the condenser second contact area portion. The at least a third wick structure contacts the condenser upper inner wall at the third maximum thickness and the at least a fourth wick structure does not contact the condenser upper inner wall. A capillary force of the at least a third wick structure is greater than a capillary force of the at least a fourth wick structure. A capillary force of the at least a first wick structure is lesser than a capillary force of the at least a third wick structure. A capillary force of the at least a second wick structure is lesser than a capillary force of the at least a fourth wick structure.

In at least one alternative embodiment, a cross-sectional shape of the at least a first wick structure portion, a cross-sectional shape of the at least a second wick structure portion, a cross-sectional shape of the at least a third wick structure portion, and a cross-sectional shape of the at least a fourth wick structure portion are semielliptical shapes. In at least one alternative embodiment, an amount of the at least a second wick structure portion is two and an amount of the at least a fourth wick structure is two. One of the at least a second wick structure portion is disposed longitudinal along the length of one side of the at least a first wick structure portion and an other of the at least a second wick structure portion is disposed longitudinal along the length of an opposite side of the at least a first wick structure portion. One of the at least a fourth wick structure portion is disposed longitudinal along the length of one side of the at least a third wick structure portion and an other of the at least a fourth wick structure portion is disposed longitudinal along the length of an opposite side of the at least a third wick structure portion.

In at least two alternative embodiment, the thin heat pipes of the pre-thin heat pipe container 600 of FIG. 12 and the pre-thin heat pipe container 600 of FIG. 13, further includes at least a vapor flow passage section configured for vapor to flow therethrough, wherein an edge of the at least a second wick structure does not contact, contact points between the upper inner wall and the lower inner wall, and an edge of the at least a fourth wick structure does not contact, contact points between the condenser upper inner wall and the condenser lower inner wall, to increase an area of the at least a vapor flow passage section.

In at least one alternative embodiment, a mesh count of the wick structure corresponding to the pre-wick structure 800A is between 100 mesh and 120 mesh, inclusive, and a mesh count of the condenser wick structure corresponding to the pre-condenser wick structure 900A is between 60 mesh and 80 mesh, inclusive. In at least one alternative embodiment, the mesh count of the wick structure corresponding to the pre-wick structure 800A is greater than the mesh count of the condenser wick structure corresponding the pre-condenser wick structure 900A, and the capillary force of the at least a first wick structure is lesser than the capillary force of the at least a third wick structure, and the capillary force of the at least a second wick structure is lesser than the capillary force of the at least a fourth wick structure, so that the working fluid is facilitated to vaporize from the higher permeability wick structure corresponding to the pre-wick structure 800A and carry latent vaporization heat from wick structure to the condenser wick structure corresponding to the pre-condenser wick structure 900A, and the working fluid is facilitated to be pulled from the higher capillary force condenser wick structure to the wick structure. As an example, heat dissipation of a thin heat pipe having the wick structure corresponding to the pre-wick structure 800A and the condenser wick structure corresponding to the pre-condenser wick structure 900A can be about 60 W, which is about 10 W or 16% greater than a thin heat pipe having only the wick structure corresponding to the pre-wick structure 800A.

In at least one alternative embodiment, the pre-wick structure 800A/900A is made of sintered metal powder. In at least one alternative embodiment, the second length is equal to or greater than the first length. In at least one alternative embodiment, the first length is at least 10 centimeters or greater.

In the embodiments, methods to manufacture yet another alternative thin heat pipe of the yet another alternative thin heat pipe container of FIG. 12 and further yet another alternative thin heat pipe of the further yet another alternative thin heat pipe container of FIG. 13 may be similar in some respects to the method to manufacture the thin heat pipe 10 of FIG. 1 before being flattened, and therefore may be best understood with reference thereto, and will not be not described again in detail. Generally, the amounts, shapes, and thicknesses of the at least a first cut-away portion 730 and the at least a second cut-away portion 720 can also be adjusted so that the at least a pre-first wick structure portions and the at least a pre-second wick structure portions, after being flattened, correspond to the at least a first wick structure portion and the at least a second wick structure portion of the yet another alternative thin heat pipe of the yet another alternative thin heat pipe container of FIG. 12 and the further yet another alternative thin heat pipe of the further yet another alternative thin heat pipe container of FIG. 13, respectively. Additionally, during formation of the pre-wick structures, respectively, different particle sizes of the metal powder can be deposited into the capillary liquid flow section S to form, after being flattened, a wick structure 800A of the yet another alternative thin heat pipe of the yet another alternative thin heat pipe container of FIG. 12 and the further yet another alternative thin heat pipe of the further yet another alternative thin heat pipe container of FIG. 13, and the pre-condenser wick structure 900A of the further yet another alternative thin heat pipe of the further yet another alternative thin heat pipe container of FIG. 13.

Following, the pre-wick structure 800A is formed by depositing a plurality of first particles of a metal powder into a portion of the capillary liquid flow section S. Next, the first particles can then be pressed or compacted together along an axial direction of the yet another alternative thin heat pipe container of FIG. 12 and the further yet another alternative thin heat pipe container of FIG. 13, respectively. Following a plurality of second particles of the metal powder can be deposited into a remaining portion of the capillary liquid flow section S of the further yet another alternative thin heat pipe container of FIG. 13. Next, the plurality of second particles can then be pressed or compacted together along an axial direction of the further yet another alternative thin heat pipe container of FIG. 13. Following the metal powder is sintered and bonded together forming the pre-wick structure 800A of the yet another alternative thin heat pipe container of FIG. 12 and the further yet another alternative thin heat pipe container of FIG. 13 and the pre-condenser wick structure 900A of the further yet another alternative thin heat pipe container of FIG. 13, respectively. The plurality of first particles can be made of finer particles and the plurality of second particles can be made of coarser particles. As an example, a medium average particle size of the plurality of first particles can be 40% or greater than a medium average particle size of the plurality of second particles. The higher permeability pre-wick structure 800A can operate at a steady capillary force. The higher capillary force pre-condenser wick structure 900A can operate initially at a decreasing capillary force. Thus, the working fluid is facilitated to vaporize from the higher permeability wick structure corresponding to the pre-wick structure 800A and carry latent vaporization heat from the wick structure to the condenser wick structure corresponding to the pre-condenser wick structure 900A, and the working fluid is facilitated to be pulled from the higher capillary force condenser wick structure to the wick structure.

In the embodiments, an amount of the evaluator section corresponding to the pre-evaluator section 690A and an amount of the condenser section corresponding to the pre-condenser section 680A are one each. In the embodiments, the amount of the evaluator section and the condenser section and disposition of the evaluator section in relation to the condenser section can be varied.

In the embodiments, an amount, shape, and thickness of the at least a first wick structure portion 220/220A/220B, and an amount, shape, and thickness of the at least a second wick structure portion 210/210A/210B can be varied for different thermal performances of and/or along the thin heat pipes 10/10A/10B.

In the embodiments, a material of the thin heat pipes 10/10A/10B and the thin heat pipes corresponding the pre-thin heat pipe containers of FIGS. 11 and 12 before being flattened can be copper and aluminum, etc., particularly, metals that are good conductors of heat and electricity.

The thin heat pipes 10/10A/10B and the thin heat pipes corresponding the pre-thin heat pipe containers of FIGS. 11 and 12 before being flattened provide optimal wick structure shape, mesh counts, and size and amount of vapor flow passage sections, to facilitate working fluid in a saturated vapor phase to flow towards cooler vapor condenser sections and facilitate working fluid to be pulled from the vapor condenser sections to the evaporator sections, preventing drying out of the working fluid and resulting in high thermal performance of thin heat pipes.

The present disclosure provides thin heat pipes 10/10A/10B and thin heat pipes corresponding to pre-thin heat pipe containers of FIGS. 12 and 13, respectively, including a thin heat pipe container 100/110A/110B, a wick structure 200/200A/200B, a working fluid, and at least a vapor flow passage section 120/120A/120B configured for vapor to flow therethrough. The thin heat pipe container 100/100A/100B includes a lower inner wall 130 and an upper inner wall 110. The wick structure 200/200A/200B is disposed only on the lower inner wall 130 to minimize thickness of the thin heat pipe 10/10A/10B and thin heat pipes corresponding to pre-thin heat pipe containers of FIGS. 12 and 13 and includes at least a first wick structure portion 220/220A/220B having a first maximum thickness FMT connected to the at least a second wick structure portion 210/210A/210B having a second maximum thickness SMT. The first maximum thickness FMT is greater than the second maximum thickness SMT and the at least a second wick structure portion 210/210A/210B does not contact, contact points 280 between the upper inner wall 110 and the lower inner wall 130 to increase an area of the at least a vapor flow passage section 120/120A/120B, facilitating the working fluid in a saturated vapor phase, carrying latent vaporization heat from high temperature sections (or evaporator sections) of the thin heat pipe 10/10A/10B, to flow towards cooler vapor condensation sections (or condenser sections) of the thin heat pipe 10/10A/10B. The at least a first wick structure portion 220/220A/220B is in contact with the upper inner wall 110 at the first maximum thickness FMT and in contact with the lesser thickness second wick structure portion 210/210A/210B to facilitate working fluid to be pulled from the vapor condensation sections to the high temperature sections, preventing drying out of the working fluid when the working fluid is in a liquid phase at the high temperature sections. The working fluid can also be facilitated to vaporize from the higher permeability high temperature sections corresponding to the pre-wick structure 800A and carry latent vaporization heat from the wick structure to the condenser wick structure corresponding to the pre-condenser wick structure 900A, and the working fluid can also be facilitated to be pulled from the higher capillary force vapor condensation sections to the high temperature sections.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some number. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A heat pipe, comprising:
a heat pipe container, being sealed, having a lower inner wall, an upper inner wall, a central axis, and a longitudinal center plane, the lower inner wall having a main area portion, a first contact area portion, and a second contact area portion, the lower inner wall extends longitudinal along a length of the heat pipe container, the main area portion extends longitudinal along the length of the heat pipe container between the first contact area portion on one side of the main area portion and the second contact area portion on an opposite side of the main area portion, the upper inner wall extends longitudinal along the length of the heat pipe container and opposite the lower inner wall, a center of the longitudinal center plane is defined by the central axis, the longitudinal center plane intersecting walls of the heat pipe container and defining contact points between the upper inner wall and the lower inner wall, the upper inner wall in contact with the lower inner wall at the first contact area portion and the second contact area portion, respectively,
a wick structure formed on the main area portion, the wick structure having at least one first wick structure portion and at least one second wick structure portion the at least one first wick structure portion is in contact with the at least one second wick structure portion and are both disposed longitudinal along the length of the main area portion, the at least one first wick structure portion having a maximum thickness that is greater than a maximum thickness of the at least one second wick structure portion, and
a working fluid sealed within the lower inner wall and upper inner wall, wherein the wick structure is not formed on the first contact area portion and the wick structure is not formed on the second contact area portion, wherein the at least a one first wick structure contacts the upper inner wall and the at least one second wick structure does not contact the upper inner wall, wherein a capillary force of the at least one first wick structure is greater than a capillary force of the at least one second wick structure, wherein a mesh count of both the at least one first wick structure portion and the at least one second wick structure portion is between 100 and 120, inclusive.

2. The heat pipe of claim 1, wherein a cross-sectional shape of the at least one first wick structure portion is a semielliptical shape.

3. The heat pipe of claim 2, wherein a cross-sectional shape of the at least one second wick structure portion is a semielliptical shape.

4. The heat pipe of claim 3, wherein an amount of the at least one second wick structure portion is two and one of the at least one second wick structure portion is disposed longitudinal along the length of one side of the at least one first wick structure portion and an other of the at least one second wick structure portion is disposed longitudinal along the length of an opposite side of the at least one first wick structure portion.

5. The thin heat pipe of claim 2, wherein a cross-sectional shape of the at least a second wick structure portion is a flat top shape.

6. The thin heat pipe of claim 5, wherein an amount of the at least a first wick structure portion is two and an amount of the at least a second wick structure portion is one, and one of the at least a first wick structure portion is disposed longitudinal along the length of one side of the at least a second wick structure portion and an other of the at least a first wick structure portion is disposed longitudinal along the length of an opposite side of the at least a second wick structure portion.

7. The thin heat pipe of claim 2, wherein a cross-sectional shape of the at least a second wick structure portion is a vert ramp shape.

8. The thin heat pipe of claim 7, wherein an amount of the at least a first wick structure portion is three and an amount of the at least a second wick structure portion is four, and the at least a first wick structure portion and the at least a second wick structure portion are alternatingly disposed longitudinal along the length of the lower inner wall, beginning with a partial end of one of the at least a second wick structure and ending with an opposite partial end of an other of the at least a second wick structure.

9. The heat pipe of claim 1, further comprising at least a vapor flow passage section configured for vapor to flow therethrough, wherein an edge of the at least one second wick structure does not contact the contact points between the upper inner wall and the lower inner wall.

10. The heat pipe of claim 1, wherein the wick structure is made of sintered metal powder.

11. A heat pipe, comprising:
a heat pipe container, being sealed, having a condenser section, an evaporator section, a central axis, and a longitudinal center plane, the evaporator section having an evaporator lower inner wall having an evaporator main area portion, an evaporator first contact area portion, an evaporator second contact area portion, and an evaporator upper inner wall, the evaporator upper inner wall connected to the evaporator lower inner wall and define a first length, and the condenser section having a condenser lower inner wall and a condenser upper inner wall, the condenser lower inner wall having a condenser main area portion, a condenser first contact area portion, a condenser second contact area portion, and a condenser upper inner wall, the condenser upper inner wall connected to the condenser lower inner wall and define a second length, one end of the evaporator section is in contact with one end of the condenser section and both are longitudinal along a length of the heat pipe container, the evaporator main area portion extends longitudinal along the first length between the evaporator first contact area portion on one side of the evaporator main area portion and the evaporator second contact area portion on an opposite side of the evaporator main area portion, the evaporator upper inner wall extends longitudinal along the first length and opposite the lower inner wall, the condenser main area portion extends longitudinal along the second length between the condenser first contact area portion on one side of the condenser main area portion and the condenser second contact area portion on an opposite side of the condenser main area portion, the condenser upper inner wall extends longitudinal along the second length and opposite the condenser lower inner wall, a center of the longitudinal center plane is defined by the central axis, the longitudinal center plane intersecting walls of the heat pipe container and defining contact points between the evaporator upper inner wall and the evaporator lower inner wall, and defining contact points between the condenser upper inner wall and the condenser lower inner wall, the evaporator upper inner wall is in contact with the evaporator lower inner wall at the evaporator first contact area portion and the evaporator second contact area portion, respectively, the condenser upper inner wall is in contact with the condenser lower inner wall at the condenser first contact area portion and the condenser second contact area portion, respectively,
an evaporator wick structure formed on the evaporator main area portion, the evaporator wick structure having at least one first wick structure portion and at least one second wick structure portion, the at least one first wick structure portion is in contact with the at least a second wick structure portion and both are disposed longitudinal along the first length, the at least one first wick structure portion of the evaporator wick structure having a maximum thickness that is greater than a maximum thickness of the at least one second wick structure portion of the evaporator wick structure,
a working fluid sealed within the lower inner wall and the upper inner wall and the condenser lower inner wall and the condenser upper inner wall,
wherein the evaporator wick structure is not formed on the first contact area portion and the evaporator wick structure is not formed on the second contact area portion,
wherein the at least one first wick structure portion of the evaporator wick structure contacts the upper inner wall and the at least one second wick structure portion of the evaporator wick structure does not contact the upper inner wall,
wherein a capillary force of the at least one first wick structure portion of the evaporator wick structure is greater than a capillary force of the at least one second wick structure portion of the evaporator wick structur,
wherein a mesh count of both the at least one first wick structure portion and the at least one second wick structure portion is between 100 and 120, inclusive.

12. The heat pipe of claim 11, further comprising a condenser wick structure, the condenser wick structure is formed on the condenser main area portion, the condenser wick structure having at least one first wick structure portion and at least one second wick structure portion, the at least one first wick structure is in contact with the at least one second wick structure and both disposed longitudinal along the second length, one end of the at least one first wick structure portion of the evaporator wick structure is in contact with one end of the at least one first wick structure portion of the condenser wick structure and one end of the at least one second wick structure portion of the evaporator wick structure is in contact with one end of the at least one second wick structure portion of the condenser wick structure, the at least one first wick structure portion of the condenser wick structure having a maximum thickness that is greater than a maximum thickness of the at least one second wick structure portion of the condenser wick structure, the condenser wick structure is not formed on the condenser first contact area portion and the condenser wick structure is not formed on the condenser second contact area portion, the at least one first wick structure portion of the condenser wick structure contacts the condenser upper inner wall and the at least one second wick structure portion of the condenser wick structure does not contact the condenser upper inner wall, a capillary force of the at least one first wick structure portion of the condenser wick structure is greater than a capillary force of the at least one second wick structure portion of the condenser wick structure, a capillary force of the at least one first wick structure portion of the evaporator wick structure is lesser than a capillary force of the at least one first wick structure portion of the condenser wick structure, and a capillary force of the at least one second wick structure portion of the evaporator wick structure is lesser than a capillary force of the at least one second wick structure portion of the condenser wick structure.

13. The thin heat pipe of claim 12, wherein a cross-sectional shape of the at least one first wick structure portion of the evaporator wick structure, a cross-sectional shape of the at least one second wick structure portion of the evaporator wick structure, a cross-sectional shape of the at least one first wick structure portion of the condenser wick structure, and a cross-sectional shape of the at least one second wick structure portion of the condenser wick structure are semielliptical shapes.

14. The heat pipe of claim 12, wherein an amount of the at least one second wick structure portion of the evaporator wick structure is two and an amount of the at least one second wick structure portion of the condenser wick structure is two, one of the at least one second wick structure portion of the evaporator wick structure is disposed longitudinal along the length of one side of the the at least one first wick structure portion of the evaporator wick structure and an other of the at least one second wick structure portion of the evaporator wick structure is disposed longitudinal along the length of an opposite side of the at least one first wick structure portion of the evaporator wick structure, and one of the at least one second wick structure portion of the condenser wick structure is disposed longitudinal along the length of one side of the at least one first wick structure portion of the condenser wick structure and an other of the at least one second wick structure portion of the condenser wick structure is disposed longitudinal along the length of an opposite side of the at least one first wick structure portion of the condenser wick structure.

15. The thin heat pipe of claim 12, further comprising at least a vapor flow passage section configured for vapor to flow therethrough, wherein an edge of the at least one second wick structure portion of the evaporator wick structure does not contact the contact points between the evaporator upper inner wall and the evaporator lower inner wall, and an edge of the at least one second wick structure portion of the condenser wick structure does not contact the contact points between the condenser upper inner wall and the condenser lower inner wall.

16. The heat pipe of claim 12, wherein the mesh count of the evaporator wick structure is greater than a mesh count of the condenser wick structure, and the capillary force of the at least one first wick structure portion of the evaporator wick structure is lesser than the capillary force of the at least one first wick structure portion of the condenser wick structure, and the capillary force of the at least one second wick structure portion of the evaporator wick structure is lesser than the capillary force of the at least one second wick structure portion of the condenser wick structure, so that the working fluid is pulled from the at least one first wick structure portion of the condenser wick structure to the at least one first wick structure portion of the evaporator wick structure, and the working fluid is pulled from the at least one second wick structure portion of the condenser wick structure to the at least one second wick structure portion of the evaporator wick structure.

17. The thin heat pipe of claim 16, wherein the mesh count of both the at least one first wick structure portion and the at least one second wick structure portion of the condenser wick structure is between 60 and 80, inclusive.

18. The heat pipe of claim 11, wherein the second length is equal to or greater than the first length.

19. The heat pipe of claim 11, wherein the first length is at least 10 centimeters or greater.

20. The heat pipe of claim 11, wherein the evaporator wick structure is made of sintered metal powder.

* * * * *